(12) United States Patent
Taki et al.

(10) Patent No.: US 7,126,390 B2
(45) Date of Patent: Oct. 24, 2006

(54) FREQUENCY CONVERSION APPARATUS

(75) Inventors: Wataru Taki, Osaka (JP); Masanori Kitaguchi, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/649,829

(22) Filed: Aug. 28, 2003

(65) Prior Publication Data

US 2004/0041598 A1   Mar. 4, 2004

(30) Foreign Application Priority Data

Aug. 28, 2002 (JP) .............................. 2002-249128

(51) Int. Cl.
*H03B 19/00* (2006.01)
(52) U.S. Cl. ...................... 327/113; 327/114
(58) Field of Classification Search ............... 327/113, 327/114; 455/130, 131, 302–307, 313–316, 455/296, 227
See application file for complete search history.

(56) References Cited

U.S. PATENT DOCUMENTS

| | | | | |
|---|---|---|---|---|
| 4,569,084 A | * | 2/1986 | Takahama | 455/131 |
| 5,010,400 A | * | 4/1991 | Oto | 725/68 |
| 5,060,297 A | * | 10/1991 | Ma et al. | 455/302 |
| 5,245,557 A | * | 9/1993 | Upton | 708/6 |
| 5,517,685 A | * | 5/1996 | Aoyama et al. | 455/260 |
| 5,822,687 A | * | 10/1998 | Bickley et al. | 455/226.1 |
| 6,034,990 A | * | 3/2000 | Kang | 375/219 |
| 6,112,070 A | * | 8/2000 | Katsuyama et al. | 455/307 |

FOREIGN PATENT DOCUMENTS

| JP | 64-5122 A | 1/1989 |
|---|---|---|
| JP | 1-238321 A | 9/1989 |

OTHER PUBLICATIONS

Humphries et al., Industrial Electronics, 1983, Breton Publishers, p. 38.*

* cited by examiner

*Primary Examiner*—Quan Tra
*Assistant Examiner*—Rey Aranda
(74) *Attorney, Agent, or Firm*—Birch, Stewart, Kolasch and Birch, LLP

(57) ABSTRACT

A frequency conversion apparatus has a high-frequency amplifier for amplifying an input high-frequency signal, a mixer for mixing the output signal of the high-frequency amplifier with a local oscillation signal, a filter for restricting the band of the output signal of the mixer to permit passage of only components within a predetermined band, and a variable filter provided between the high-frequency amplifier and the mixer and having a controllable cut-off frequency. With this configuration, it is possible to reduce back talk at low cost without inviting variation of input return loss characteristics.

4 Claims, 6 Drawing Sheets

(a) WHEN RECEIVING
    A HIGH FREQUENCY (b) WHEN RECEIVING
    A LOW FREQUENCY

FREQUENCY CONVERSION APPARATUS

This Nonprovisional application claims priority under 35 U.S.C. § 119(a) on patent application Ser. No(s). 2002-240129 filed in Japan on Aug. 28, 2002, the entire contents of which are hereby incorporated by reference.

BACKGROUND OF THE INVENTION

1. Field of the Invention

The present invention relates to a frequency conversion apparatus used in a tuner portion of a cable television receiver or the like.

2. Description of the Prior Art

FIG. 8 is a block diagram of a conventional configuration of a double-conversion tuner apparatus. The double-conversion tuner apparatus extracts a desired frequency component from the high frequency signal (hereinafter refereed to as an RF (radio frequency) signal) fed thereto, and generates an intermediate-frequency signal (hereinafter referred to as an IF (intermediate frequency) signal) that is easily handled by the detector circuit provided in the succeeding stage.

As shown in FIG. 8, the conventional double-conversion tuner apparatus includes a first band-pass filter 10a, an attenuator 11, a high-frequency amplifier 12, a first local oscillator 13, a first mixer 14, a second band-pass filter 15, a second local oscillator 16, a second mixer 17, a third band-pass filter 18, and an intermediate-frequency amplifier 19.

Now, the frequency conversion operation of the double-conversion tuner apparatus configured as described above will be described with reference to FIG. 9. In the double-conversion tuner apparatus configured as described above, a reception signal that has passed through the first band-pass filter 10a is mixed with a first local oscillation signal (having a frequency flo) in the first mixer 14. Thus, the signal of the reception channel (having a frequency f1) is converted into a first IF signal (having a frequency flo-f1).

On the other hand, if the signal of a channel (having a frequency f2) other than the reception channel passes through the first band-pass filter 10a, the signal of this other channel is converted into an unwanted signal (having a frequency flo-f2) by the first mixer 14. Here, if the frequency f2 of this other channel is higher than the frequency f1 of the reception channel, and the frequency flo-f2 of the unwanted signal is within the pass band of the first band-pass filter 10a, the unwanted signal leaks through the first band-pass filter 10a to the terminal IN. This phenomenon is called back talk, and adversely affects the frequency conversion and other characteristics of the double-conversion tuner apparatus.

For this reason, in conventional double-conversion tuner apparatuses, as a technique of reducing unwanted signals, such as back talk, that leak from inside the apparatus to the terminal IN, configurations as shown in FIGS. 10A to 10C are adopted. In the configuration shown in FIG. 10A, between the high-frequency amplifier 12 and the first mixer 14, there is added an isolation amplifier A of which the input and output are isolated from each other. In the configuration shown in FIG. 10B, the first band-pass filter 10a is replaced with a split-band-type band-pass filter 10b. In the configuration shown in FIG. 10C, the first band-pass filter 10a is replaced with a variable band pass filter 10c of which the cut-off frequency can be controlled.

It is true that, by configuring double-conversion tuner apparatuses in these ways, it is possible to reduce the leakage of unwanted signals, such as back talk, and thereby enhance the frequency conversion and other characteristics of the double-conversion tuner apparatuses.

However, in the double-conversion tuner apparatus shown in FIG. 10A, the addition of the isolation amplifier A disadvantageously increases costs and degrades distortion characteristics. In the double-conversion tuner apparatus shown in FIG. 10B, building the split-band-type band-pass filter requires a plurality of band-pass filters. This disadvantageously increases the number of components, and thus increases costs and trouble in assembly. In the double-conversion tuner apparatus shown in FIG. 10C, reduction of back talk can be realized at lower cost than in the above two configurations, but suffers from variation of the characteristics of the band-pass filter 10c with the reception frequency. This disadvantageously causes variation of input return loss characteristics (see FIGS. 11A and 11B).

SUMMARY OF THE INVENTION

An object of the present invention is to provide a frequency conversion apparatus that can reduce back talk and the like at low cost without inviting variation of input return loss characteristics.

To achieve the above object, according to the present invention, a frequency conversion apparatus has a high-frequency amplifier for amplifying an input high-frequency signal, a mixer for mixing the output signal of the high-frequency amplifier with a local oscillation signal, a filter for restricting the band of the output signal of the mixer to permit passage of only components within a predetermined band, and a variable filter provided between the high-frequency amplifier and the mixer and having a controllable cut-off frequency. Here, the cut-off frequency of the variable filter is so controlled as to vary with the reception channel signal.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE INVENTION

Hereinafter, as embodiments of the present invention, double-conversion tuner apparatuses for use in the tuner portion of a cable television receiver or the like will be described.

Figure 1:
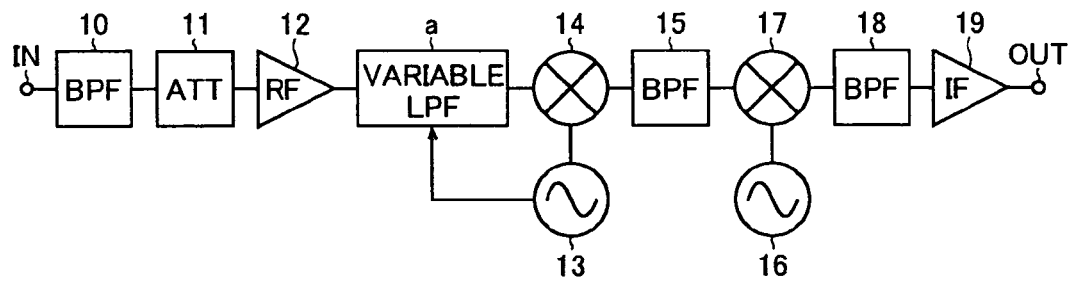
FIG. 1 is a block diagram of the double-conversion tuner apparatus of a first embodiment of the invention.

First, a first embodiment of the invention will be described. FIG. 1 is a block diagram of the double-conversion tuner apparatus of the first embodiment of the invention. As shown in this figure, the double-conversion tuner apparatus of this embodiment includes a first band-pass filter 10 (hereinafter referred to as the first BPF 10) that restricts the band of an RF signal fed in via a terminal IN so as to permit passage of only desired frequency components, an attenuator 11 (hereinafter referred to as the ATT 11) that attenuates the output RF signal of the first band-pass filter 10, a high-frequency amplifier 12 (hereinafter referred to as the RF amplifier 12) that amplifies the output RF signal of the attenuator 11, a first local oscillator 13 that generates a first local oscillation signal, a first mixer that mixes the output RF signal of the RF amplifier 12 with the first local oscillation signal to generate a first IF signal, a second band-pass filter 15 (hereinafter referred to as the second BPF 15) that restricts the band of the first IF signal to remove unwanted signal components therefrom, a second local oscillator 16 that generates a second local oscillation signal, a second mixer 17 that mixes the output IF signal of the second BPF 15 with the second local oscillation signal to generate a second IF signal, a third band-pass filter 18 (hereinafter referred to as the third BPF 18) that restricts the band of the second IF signal to remove unwanted signal components therefrom, and an intermediate-frequency amplifier 19 (hereinafter referred to as the IF amplifier 19) that amplifiers the output IF signal of the third BPF 18 and then feeds it to a terminal OUT. Moreover, between the RF amplifier 12 and the first mixer 14, there is provided a variable low-pass filter "a" (hereinafter referred to as the variable LPF "a") of which the cut-off frequency is controllable.

Figure 2:
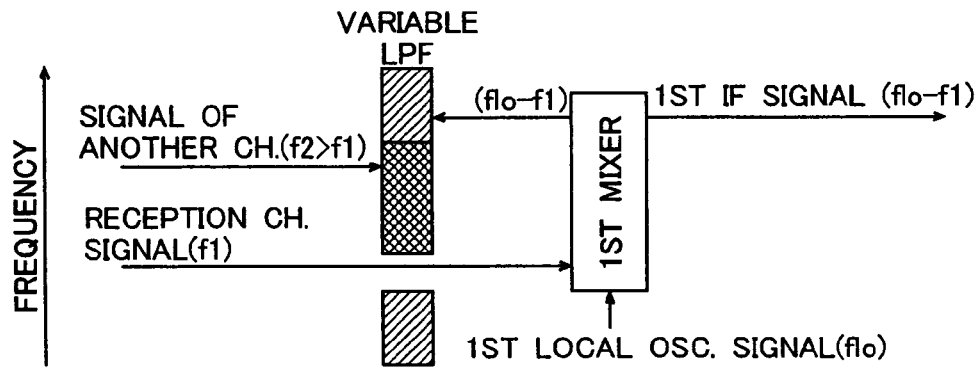
FIG. 2 is a diagram schematically illustrating the frequency conversion operation of the double-conversion tuner apparatus of the first embodiment.

Now, the frequency conversion operation of the double-conversion tuner apparatus configured as described above will be described with reference to FIG. 2. In the double-conversion tuner apparatus configured as described above, a reception signal that has passed through the variable LPF "a" is mixed with the first local oscillation signal (having a frequency flo) in the first mixer 14. Here, the cut-off frequency of the variable LPF "a" is so controlled as to vary with the reception channel signal, and therefore the desired signal of the reception channel (having a frequency f1) is permitted to pass through the variable LPF "a," and is then converted into the first IF signal (having a frequency flo-f1) in the first mixer 14. By contrast, the signal of another channel (having a frequency f2) having a higher frequency than the signal of the reception channel is shut off by the variable LPF "a," and thus cannot reach the first mixer 14. In this way, in this embodiment, it is possible to suppress the generation of an unwanted signal (having a frequency flo-f2) corresponding to the signal of that other channel and thereby reduce the leakage of unwanted signals to the terminal IN.

In the stage preceding the variable LPF "a" is provided the RF amplifier 12, and this RF amplifier 12 functions also as an isolation amplifier. Therefore, reflected waves outside the pass band of the variable LPF "a" are shut off by the RF amplifier 12, and thus cannot reach the terminal IN. Accordingly, controlling the cut-off frequency of the variable LPF "a" does not cause variation of input return loss characteristics.

Figure 3:
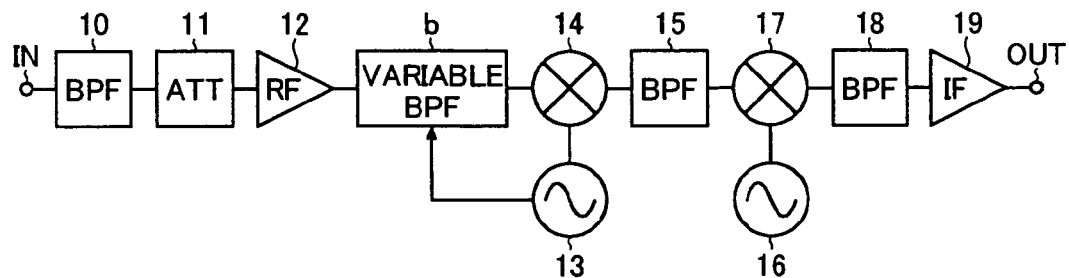
FIG. 3 is a block diagram of the double-conversion tuner apparatus of a second embodiment of the invention.

Next, a second embodiment of the invention will be described. FIG. 3 is a block diagram of the double-conversion tuner apparatus of the second embodiment of the invention. Here, such circuit blocks which are counterparts of those in the first embodiment are identified with the same reference numerals and symbols as in FIG. 1, and their explanations will not be repeated; that is, the following description concentrates on the features characterizing this embodiment.

As shown in FIG. 3, in the double-conversion tuner apparatus of this embodiment, between the RF amplifier 12 and the first mixer 14, there is provided, instead of the variable LPF "a" used in the first embodiment, a variable band-pass filter "b" (hereinafter referred to as the variable BPF "b") of which the cut-off frequency is controllable.

In the double-conversion tuner apparatus configured as described above, a reception signal that has passed through the variable BPF "b" is mixed with the first local oscillation signal in the first mixer 14. Here, the cut-off frequency of the variable BPF "b" is so controlled as to vary with the reception channel signal, and therefore the desired signal of the reception channel is permitted to pass through the variable BPF "b", and is then converted into the first IF signal. By contrast, the signal of a channel other than the reception channel is shut off by the variable BPF "b", and thus cannot reach the first mixer 14. In this way, in this embodiment, it is also possible to suppress generation of unwanted signals (having frequencies fa±fb, 2fa±fb, etc.) due to high-order distortion occurring among the signals of other channels (having frequencies fa and fb). Thus, as compared with in the first embodiment described earlier, it is possible to further reduce the leakage of unwanted signals to the terminal IN.

Figure 4:
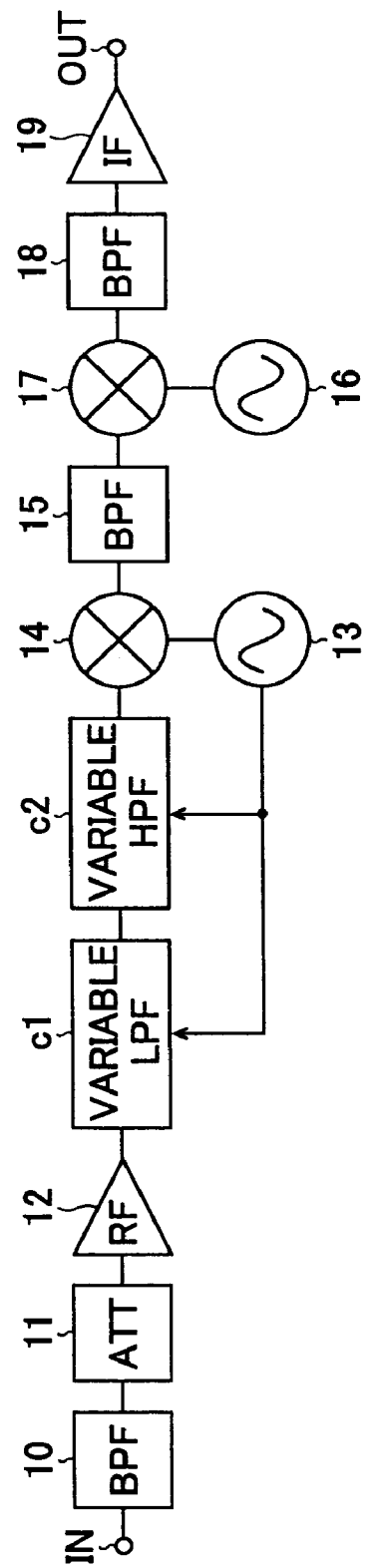
FIG. 4 is a block diagram of the double-conversion tuner apparatus of a third embodiment of the invention.

Next, a third embodiment of the invention will be described. FIG. 4 is a block diagram of the double-conversion tuner apparatus of the third embodiment of the invention. Here, such circuit blocks which are counterparts of those in the second embodiment are identified with the same reference numerals and symbols as in FIG. 3, and their explanations will not be repeated; that is, the following description concentrates on the features characterizing this embodiment.

As shown in FIG. 4, in the double-conversion tuner apparatus of this embodiment, between the RF amplifier 12 and the first mixer 14, there are provided, instead of the variable BPF "b" used in the second embodiment, a variable low-pass filter "c1" and a variable high-pass filter "c2" (hereinafter referred to as the variable LPF "c1" and the variable HPF "c2," respectively) of which the cut-off frequencies are controllable. This configuration, as compared with one including a single variable band-pass filter, makes it easier to secure a wide band. Thus, it is possible to prevent mismatch between the reception signal and the pass band of the filter without requiring the filter to have an unduly high degree of followability to the reception signal.

Figure 5:
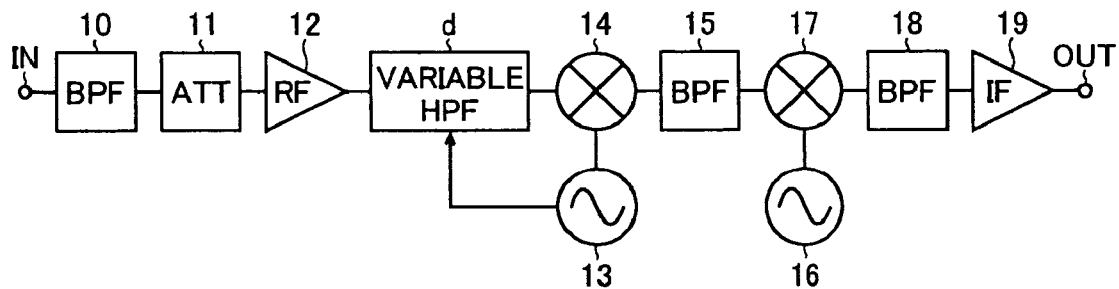
FIG. 5 is a block diagram of the double-conversion tuner apparatus of a fourth embodiment of the invention.

Next, a fourth embodiment of the invention will be described. FIG. 5 is a block diagram of the double-conversion tuner apparatus of the fourth embodiment of the invention. Here, such circuit blocks which are counterparts of those in the first embodiment are identified with the the same reference numerals and symbols as in FIG. 1, and their explanations will not be repeated; that is, the following description concentrates on the features characterizing this embodiment.

As shown in FIG. 5, in the double-conversion tuner apparatus of this embodiment, between the RF amplifier 12 and the first mixer 14, there is provided, instead of the variable LPF "a" used in the first embodiment, a variable high-pass filter "d" (hereinafter referred to as the variable HPF "d") of which the cut-off frequency is controllable. With this configuration, it is possible to reduce the generation of unwanted signals due to high-order distortion occurring among the signals of other channels when a high-frequency signal is received. Thus, it is possible to reduce the leakage of unwanted signals to the terminal IN.

Figure 6:
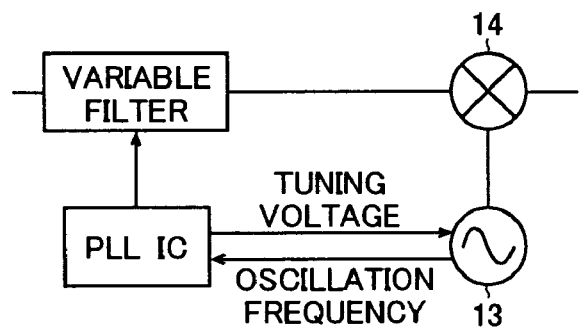
FIG. 6 is a block diagram of an example of the configuration of the variable filter controller.

In the first to fourth embodiments described above, the cut-off frequency of the variable filters "a" to "d" may be controlled by use of the phase-locked loop (PLL) circuit that controls the frequency of the first oscillation signal (see FIG. 6). With this configuration, it is possible to eliminate the need to separately provide a circuit for controlling the cut-off frequency of the variable filters "a" to "d." Thus, it is possible to control the cut-off frequency of the variable filters "a" to "d" so that it varies according to the input RF signal without unduly increasing the scale of the apparatus.

Figure 7:
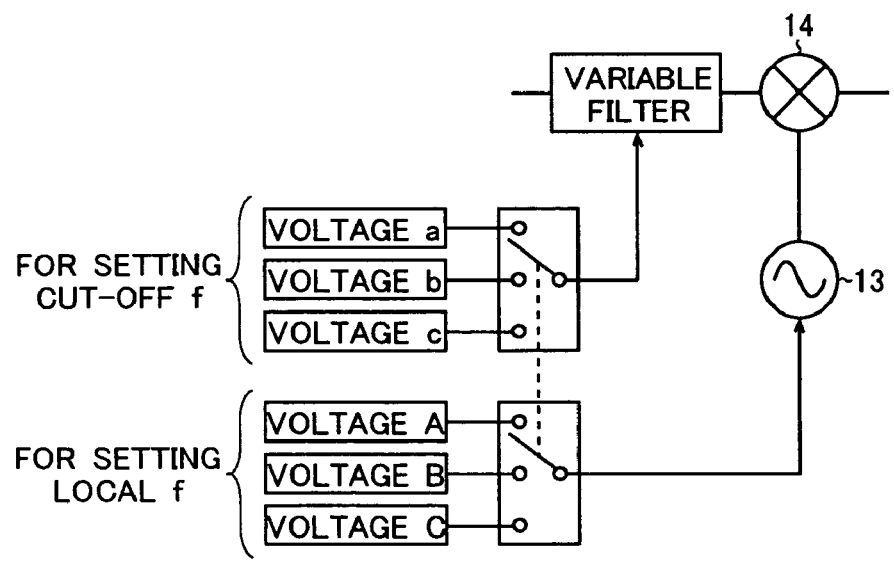
FIG. 7 is a block diagram of another example of the configuration of the variable filter controller.
Figure 8:
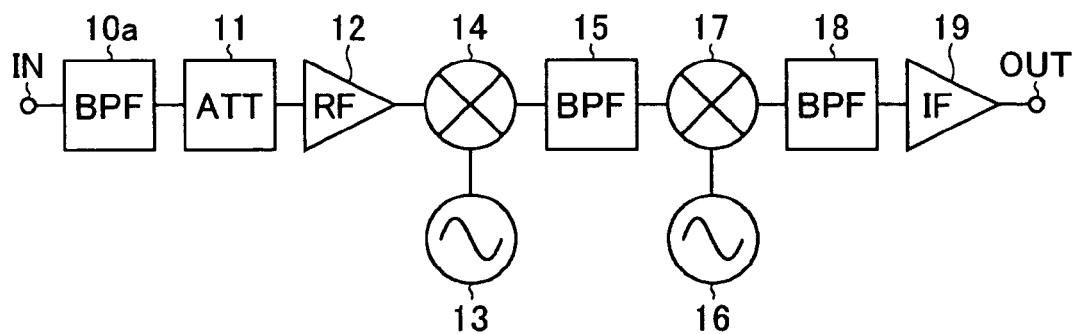
FIG. 8 is a block diagram of an example of a conventional configuration of a double-conversion tuner apparatus.
Figure 9:
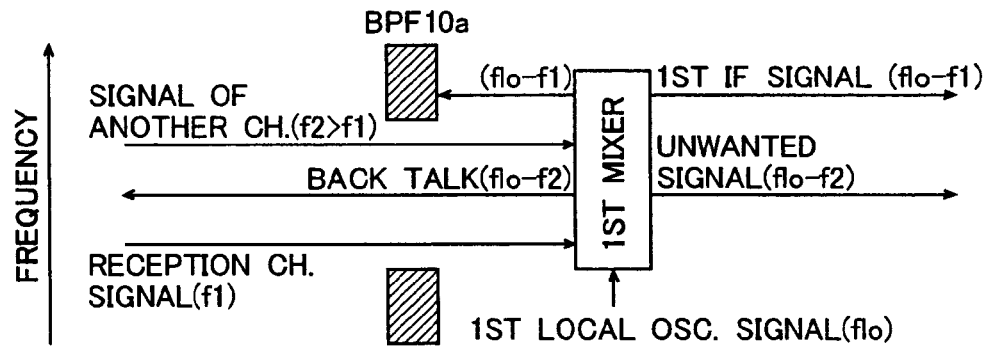
FIG. 9 is a diagram schematically illustrating the frequency conversion operation of the conventional double-conversion tuner apparatus.
Figure 10A:
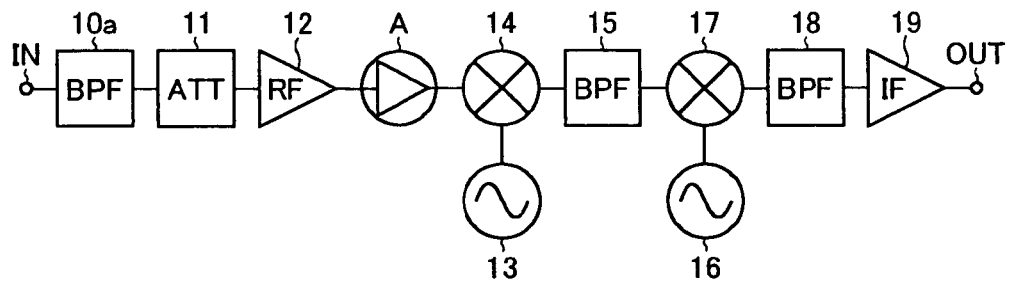
FIGS. 10A to 10C are block diagrams of other examples of conventional configurations of a double-conversion tuner apparatus.
Figure 10B:
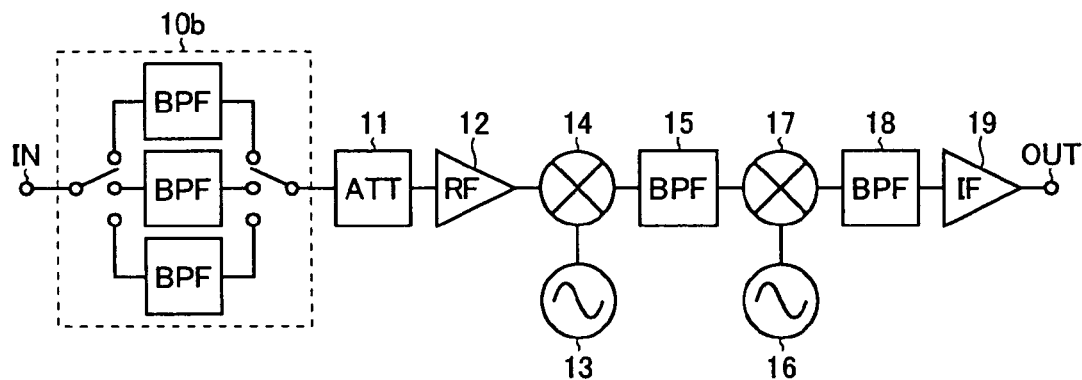
Figure 10C:
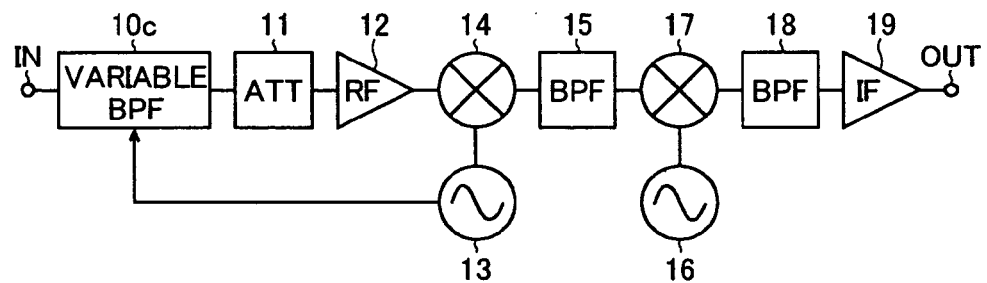
Figure 11A:
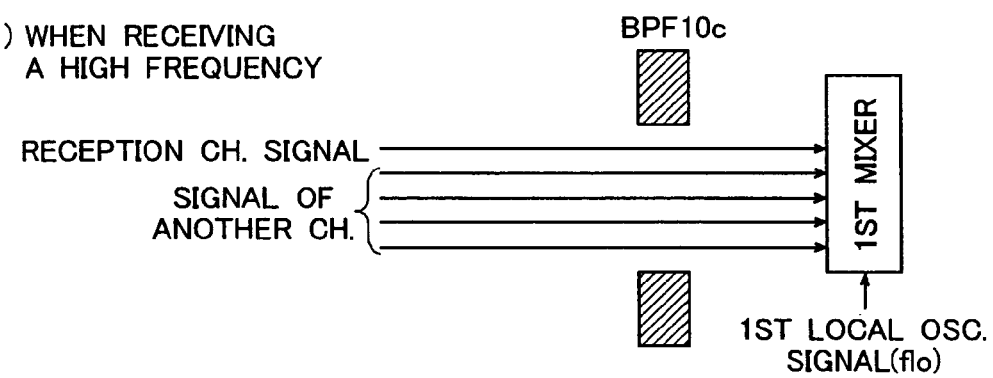
FIGS. 11A and 11B are diagrams schematically illustrating how input return loss characteristics vary as the cut-off frequency of the band-pass filter 10c is controlled.
Figure 11B:
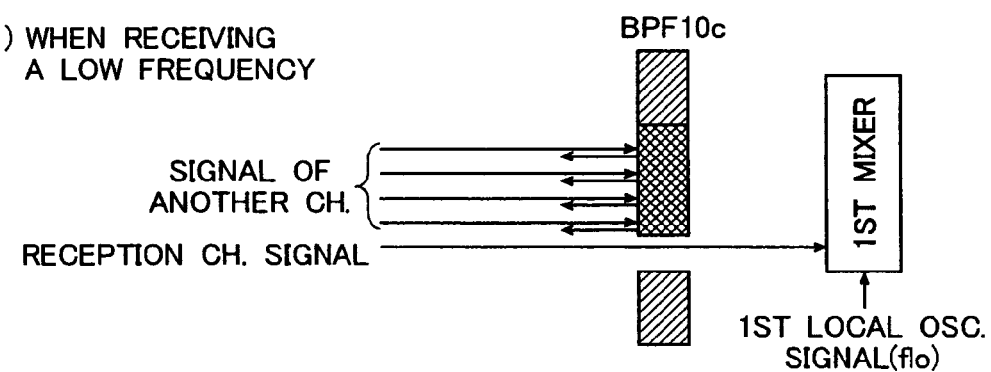

Alternatively, in the first to fourth embodiments described above, the cut-off frequency of the variable filters "a" to "d" may be controlled by a voltage synthesizing method whereby one among a plurality of predetermined voltages is selected according to which channel is to be received (see FIG. 7). With this configuration, as opposed to one in which the cut-off frequency of the variable filters "a" to "d" is controlled by use of a PLL circuit, it is possible to separately set the voltages to be supplied to the variable filters "a" to "d" and to the first local oscillation circuit. This makes it easy to adjust the followability of the filter to the reception channel signal.

As described hereinbefore, with a frequency conversion apparatus according to the present invention, it is possible to reduce back talk and the like at low cost without inviting variation of input return loss characteristics.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A frequency conversion apparatus comprising:
a filter having a fixed cut-off frequency for restricting a band of a reception signal so as to selectively pass only a first frequency band component;
a combination amplification and isolation amplifier for amplifying the reception signal having passed through the filter;
a variable filter having a variable cut-off frequency for further restricting the band of the reception signal having been amplified by the amplifier, so as to cut off at least part of the first frequency band component and thereby to selectively pass only a second frequency band component; and
a mixer for mixing the reception signal having passed through the variable filter with a local oscillation signal,
wherein the variable filter is built by serially connecting together a variable low-pass filter for selectively passing only a low band component of a signal inputted thereto and a variable high-pass filter for selectively passing only a high band component of a signal inputted thereto, the cut-off frequency of the variable filter being controlled to vary according to a reception channel signal, and wherein the amplifier cuts off reflected waves that fall outside a pass band of the variable filter,
wherein the cut-off frequency of the variable filter is controlled by a voltage synthesizing circuit that chooses among a plurality of predetermined voltages.

2. A frequency conversion apparatus comprising:
a filter having a fixed cut-off frequency for restricting a band of a reception signal, so as to selectively pass only a first frequency band component;
a combination amplification and isolation amplifier for amplifying the reception signal having passed through the filter;
a variable filter having a variable cut-off frequency for further restricting the band of the reception signal having been amplified by the amplifier so as to cut off at least part of the first frequency band component and thereby to selectively pass only a second frequency band component; and
a mixer for mixing the reception signal having passed through the variable filter with a local oscillation signal,
wherein the variable filter is a variable high-pass filter for selectively passing only a high-band component of a signal inputted thereto, the cut-off frequency of the variable filter being controlled to vary according to a reception signal, and
wherein the amplifier cuts off reflected waves that fall outside a pass band of the variable filter,
wherein the cut-off frequency of the variable filter is controlled by a voltage synthesizing circuit that chooses among a plurality of predetermined voltages.

3. A method of reducing unwanted signals in a frequency conversion apparatus comprising:
restricting a band of a reception signal with a filter having a fixed cut-off frequency so as to selectively pass only a first frequency band component;
amplifying the reception signal with a combination amplification and isolation amplifier, having passed through the filter;
restricting the band of the reception signal having been amplified with a variable filter having a variable cut-off frequency, so as to cut off at least part of the first frequency band component and thereby to selectively pass only a second frequency band component; and
mixing the reception signal having passed through the variable filter with a local oscillation signal,
wherein the variable filter built by serially connecting together a variable low-pass filter for selectively passing only a low band component of a signal inputted thereto and a variable high-pass filter for selectively passing only a high band component of a signal inputted thereto, the cut-off frequency of the variable filter being controlled to vary according to a reception channel signal, and
wherein the amplifier cut off reflected waves that fall outside a pass band of the variable filter,
wherein the cut-off frequency of the variable filter is controlled by a voltage synthesizing circuit that chooses among a plurality of predetermined voltages.

4. A method of reducing unwanted signals in a frequency conversion apparatus comprising:
restricting a band of a reception signal with a filter having a fixed cut-off frequency, so as to selectively pass only a first frequency band component;

amplifying the reception signal with a combination amplification and isolation amplifier, having passed through the filter;

restricting the band of the reception signal having been amplified with a variable filter having a variable cut-off frequency, so as to cut off at least part of the first frequency band component and thereby to selectively pass only a second frequency band component; and mixing the reception signal having passed through the variable filter with a local oscillation signal, wherein the variable filter is a variable high-pass filter for selectively passing only a high-band component of a signal inputted thereto, the cut-off frequency of the variable filter being controlled to vary according to a reception signal, and wherein the amplifier cuts off reflected waves that fall outside a pass band of the variable filter, wherein the cut-off frequency of the variable filter is controlled by a voltage synthesizing circuit that chooses among a plurality of predetermined voltages.

* * * * *